(12) United States Patent
Nagatomo et al.

(10) Patent No.: US 7,830,943 B2
(45) Date of Patent: Nov. 9, 2010

(54) VERTICAL CAVITY SURFACE EMITTING LASER AND METHOD OF MANUFACTURING TWO-DIMENSIONAL PHOTONIC CRYSTAL OF VERTICAL CAVITY SURFACE EMITTING LASER

(75) Inventors: Yasuhiro Nagatomo, Kawasaki (JP); Mamoru Uchida, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/678,855

(22) Filed: Feb. 26, 2007

(65) Prior Publication Data

US 2007/0201528 A1  Aug. 30, 2007

(30) Foreign Application Priority Data

Feb. 28, 2006  (JP) .............................. 2006-051892

(51) Int. Cl.
*H01S 3/08* (2006.01)
(52) U.S. Cl. ............................ 372/99; 372/50.1; 372/98
(58) Field of Classification Search ................ 372/50.1, 372/98, 99
See application file for complete search history.

(56) References Cited

U.S. PATENT DOCUMENTS

| | | | |
|---|---|---|---|
| 5,701,325 A | 12/1997 | Ouchi et al. ................... 372/96 |
| 6,563,137 B2 | 5/2003 | Uchida ........................ 257/84 |
| 6,810,056 B1* | 10/2004 | Lipson et al. ............ 372/46.01 |
| 7,242,837 B2* | 7/2007 | Talneau et al. ............... 385/129 |
| 2005/0089075 A1* | 4/2005 | Baba et al. ..................... 372/50 |

OTHER PUBLICATIONS

D.S. Song et al., "Single-fundamental-mode photonic-crystal vertical-cavity surface-emitting lasers." Applied Physics Letters, vol. 80, No. 21, pp. 3901-3903, May 27, 2002.
N. Yokouchi et al., "Etching depth dependence of the effective refractive index in two-dimensional photonic-crystal-patterned vertical-cavity surface-emitting laser structures." Applied Physics Letters, vol. 82, No. 9, pp. 1344-1346, Mar. 3, 2003.
S. Fan et al., "Analysis of guided resonances in photonic crystal slabs." Physical Review B, vol. 65, No. 235112, pp. 235112-1 to 235112-8 (2002).
A. Rosenberg et al., "Guided resonances in asymmetrical GaN photonic crystal slabs observed in the visible spectrum." Optics Express, vol. 13, No. 17, pp. 6564-6571, Aug. 22, 2005.

* cited by examiner

*Primary Examiner*—Tod T Van Roy
(74) *Attorney, Agent, or Firm*—Fitzpatrick, Cella, Harper & Scinto

(57) ABSTRACT

A vertical cavity surface emitting laser includes an active layer between a first reflector and a second reflector and at least either the first reflector or the second reflector includes a two-dimensional photonic crystal. The two-dimensional photonic crystal has a structure 106 showing an ununiform effective refractive index distribution in the plane of the reflector to realize both a high reflectivity and transverse mode control at the same time.

9 Claims, 3 Drawing Sheets

VERTICAL CAVITY SURFACE EMITTING LASER AND METHOD OF MANUFACTURING TWO-DIMENSIONAL PHOTONIC CRYSTAL OF VERTICAL CAVITY SURFACE EMITTING LASER

BACKGROUND OF THE INVENTION

1. Field of the Invention

This invention relates to a vertical cavity surface emitting laser and a method of manufacturing a two-dimensional photonic crystal of such a vertical cavity surface emitting laser.

2. Description of the Related Art

Known surface emitting lasers include vertical cavity surface emitting lasers prepared by sandwiching an active region at opposite sides thereof between two reflectors and forming an optical cavity in the direction perpendicular to the substrate surface so as to emit a light beam in the direction perpendicular to the substrate surface.

Research efforts are being intensively paid on vertical cavity surface emitting lasers because they provide a number of advantages as listed below.

A vertical cavity surface emitting laser emits a light beam having a profile close to a circle that can be optically coupled with an optical fiber with ease. The laser can be examined in a wafer without requiring cleavage. The laser can be driven to operate at a low threshold of about 0.1 milliamperes. The light beam emitted from the laser can be modulated at high speed. Such a vertical cavity surface emitting laser is particularly advantageous for in-plane integration.

While a vertical cavity surface emitting laser provides many advantages, it is accompanied by problems including that the diameter of the beam that can oscillate in a single transverse mode is small (not greater than 4 µmø) and that the polarization thereof is not stable. These and other problems make the laser less feasible for practical use.

Meanwhile, Appl. Phys. Lett., Vol. 80, 3901 describes an attempt of transverse mode control by arranging a two-dimensional photonic crystal in a distributed Bragg reflector (to be referred to as DBR hereinafter) at one side of a vertical cavity surface emitting laser.

According to the above article, a two-dimensional photonic crystal that includes a point defect portion at the center is prepared by boring holes in the DBR operating as the upper reflector of the vertical cavity surface emitting laser and confining light there by utilizing the difference of effective refractive index for the purpose of transverse mode control.

More specifically, the point defect portion is used as core and the photonic crystal part surrounding the core is operated as clad for the purpose of transverse mode control.

Appl. Phys. Lett., Vol. 82, 1344 reports that it is confirmed that the oscillation wavelengths of vertical cavity surface emitting lasers having a two-dimensional photonic crystal in the upper DBR differ from each other when the depths of their holes are differentiated. This is because the effective refractive index varies as a function of the depth of the holes.

Physical Review B, Vol. 65, 235112 and Optics Express, Vol. 13, 6564 report that it is found as a result of looking into reflected light and transmitted light of a two-dimensional photonic crystal slab that light of a certain frequency is reflected with an efficiency of about 100% when light is made to strike the two-dimensional photonic crystal slab in a direction perpendicular to the surface of the slab. Thus, a two-dimensional photonic crystal slab can be used as a reflector having a high reflectivity.

SUMMARY OF THE INVENTION

As described above, a two-dimensional photonic crystal can be used to control the mode of light and also as a reflector having a high reflectivity.

However, the state of the art cannot provide a reflector of a two-dimensional photonic crystal that can realize both a high reflectivity and a stable transverse mode control at the same time when such a two-dimensional photonic crystal is applied to a reflector of a vertical cavity surface emitting laser.

In view of the above-identified problems, it is therefore the object of the present invention to provide a vertical cavity surface emitting laser equipped with a reflector that can realize both a high reflectivity and a stable transverse mode control and a method of manufacturing a two-dimensional photonic crystal of such a vertical cavity surface emitting laser.

According to the present invention, the above object is achieved by providing a vertical cavity surface emitting laser and a method of manufacturing a two-dimensional photonic crystal of a vertical cavity surface emitting laser as defined below.

In an aspect of the present invention, there is provided a vertical cavity surface emitting laser including an active layer between a first reflector and a second reflector; at least either the first reflector or the second reflector including a two-dimensional photonic crystal; the reflector including the two-dimensional photonic crystal having a structure showing an ununiform effective refractive index distribution in the plane of the reflector.

In the above laser, the structure realizing the ununiform effective refractive index distribution can be formed by modulating the depth of holes formed in the two-dimensional photonic crystal for transverse mode control.

In the above laser, the depth of the holes can be modulated by arranging a filler in the holes of the two-dimensional photonic crystal.

In the above laser, the depth of the holes can be modulated in a Gaussian form or modulated to make the depth proportional to the distance from or the square of the distance from the center.

In the above laser, the structure realizing the ununiform effective refractive index distribution can be formed by ununiformly changing the density of the holes of the two-dimensional photonic crystal.

In the above laser, the two-dimensional photonic crystal can be formed in a distributed Bragg reflector constituting the reflectors of the vertical cavity surface emitting laser.

In another aspect of the present invention, there is provided a method of manufacturing a two-dimensional photonic crystal of the vertical cavity surface emitting laser as mentioned above, the method including: forming holes showing an ununiform distribution of depth in the two-dimensional photonic crystal.

In the above method, the holes showing an ununiform distribution of depth can be formed by dry etching so as to show a pattern of hole diameters increasing as a function of the distance from a center of the two-dimensional photonic crystal.

In the above method, the ununiform distribution of depth can be formed by arranging a filler in the holes of the two-dimensional photonic crystal.

In the above method, the ununiform distribution of depth can be formed to show a Gaussian distribution profile or to make the depth proportional to the distance from or the square of the distance from the center.

In still another aspect of the present invention, there is provided a vertical cavity surface emitting laser including a first reflector, a second reflector and an active layer interposed between the reflectors arranged on a substrate; at least either the first reflector or the second reflector having a two-dimensional photonic crystal structure; the two-dimensional photonic crystal structure showing a refractive index pattern diminishing from the center portion of a light emitting region toward the outer periphery thereof.

Thus, according to the present invention, it is possible to realize a vertical cavity surface emitting laser equipped with a reflector that can realize both a high reflectivity and a stable transverse mode control and a method of manufacturing a two-dimensional photonic crystal of such a vertical cavity surface emitting laser.

Further features of the present invention will become apparent from the following description of exemplary embodiments with reference to the attached drawings.

DESCRIPTION OF THE EMBODIMENTS

Figure 1:
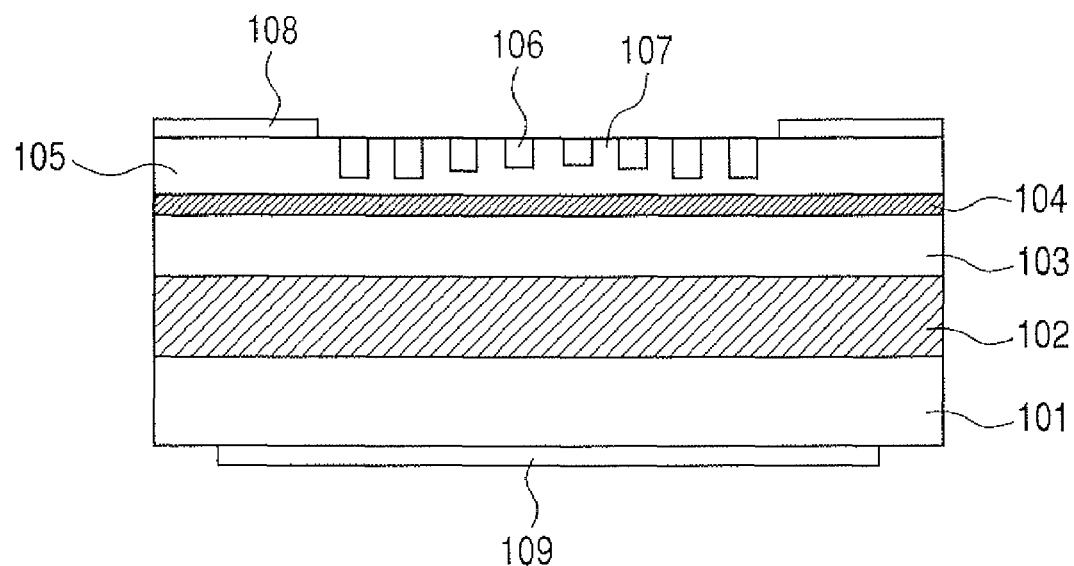
FIG. 1 is a schematic illustration of the vertical cavity surface emitting laser of Example 1, illustrating the configuration thereof.

The object of the present invention is achieved by providing a vertical cavity surface emitting laser and a method of manufacturing a two-dimensional photonic crystal of a vertical cavity surface emitting laser as defined above based on the findings as described below that are obtained as a result of intensive research efforts paid by the inventors of the present invention.

More specifically, the inventors found that a reflector including a two-dimensional photonic crystal is adapted to stable transverse mode control at high reflectivity when the reflector is formed to have a structure showing an ununiform effective refractive index distribution in the plane thereof at the time of preparing a vertical cavity surface emitting laser by using the reflector.

As pointed out earlier, a method of changing the effective refractive index by changing the depth of the holes of a two-dimensional photonic crystal is known (Appl. Phys. Lett., Vol. 82, 1344).

However, according to the present invention, the depth of all the holes is not made to vary uniformly but a new arrangement is adopted to modulate the depth of the holes.

In an embodiment of the present invention, it is possible to adopt an arrangement for realizing an ununiform effective refractive index distribution not by uniformly changing the depth of all the holes but by preparing holes showing an ununiform distribution of depth.

Examples of ununiform distribution of depth include a Gaussian distribution, a distribution of depth proportional to the distance from or proportional to the square of the distance from the center.

Other techniques for realizing an ununiform distribution of depth include one with which uniform holes are prepared in a two-dimensional photonic crystal and a filer is arranged ununiformly in the holes to realize an ununiform effective refractive index distribution.

It is also possible to modulate the effective refractive index distribution by changing the density of holes ununiformly.

An embodiment of vertical cavity surface emitting laser according to the present invention is similar to conventional general vertical cavity surface emitting lasers in terms of basic arrangement except the reflector that includes a two-dimensional photonic crystal.

For example, the double-heterostructure, the multiple quantum well structure or the quantum dot structure that is used in ordinary vertical cavity surface emitting lasers can also be applied to the active layer and the clad layer of an embodiment of vertical cavity surface emitting laser according to the present invention.

Additionally, the cavity length L that is defined by the active layer and the clad layer can be designed in such a way that the hill portion of the stationary wave of resonant light is located in the active layer.

Materials that can be used for the active layer include GaAs/AlGaAs, InGaAsP/InP, AlGaInP/GaInP, GaN/InGaN/AlGaN and GaInNAs/AlGaAs.

Therefore, a vertical cavity surface emitting laser according to the present invention does not differ significantly from conventional vertical cavity surface emitting lasers from these points of view.

Now, the present invention will be described further by way of examples.

EXAMPLE 1

A vertical cavity surface emitting laser according to the present invention is prepared in Example 1 in a manner as described below.

FIG. 1 is a schematic illustration of the vertical cavity surface emitting laser of Example 1, illustrating the configuration thereof.

In FIG. 1, there are illustrated an n-type InP substrate 101, a DBR 102, a lower clad (spacer) 103, an active layer 104, an upper clad 105, cylindrical holes 106 and a two-dimensional photonic crystal 107.

In this example, a DBR 102 is formed on an n-type InP substrate 101 by laying 30 periods of thin AlGaInAs/InP film, using a crystal growth technique, and a lower clad (spacer) 103 of n-type InAlAs is arranged thereon.

An active layer 104 having a multiple quantum well structure of AlGaInAs/InP is arranged on the spacer 103. As the layer 104 is excited by light or electric current, the layer 104 emits light of a wavelength band centered at about 1.53 μm.

An upper clad 105 of p-type InAlAs is arranged on the active layer 104.

Then, a two-dimensional photonic crystal 107 having cylindrical holes 106 is formed in the upper surface of the upper clad 105.

While the diameter and the lattice constant of the cylindrical holes 106 are uniform, the depth of the cylindrical holes 106 is modulated in a Gaussian form. In other words, the depth of the cylindrical holes 106 increases as a function of the distance from the center.

The diameter, the lattice constant and the depth at the center of the cylindrical holes are so selected that the two-dimensional photonic crystal operates as reflector that reflects light of a desired wavelength range with a high efficiency.

Then, as a result, a laser cavity structure is formed to give rise to laser oscillation when an electric current is injected from an upper electrode 108 and a lower electrode 109.

Additionally, it is possible to control the mode of light by way of effective refractive index modulation by modulating the depth of the cylindrical holes.

More specifically, light emitted from the vertical cavity surface emitting laser shows an intensity distribution where high intensities are concentrated in a region where the effective refractive index is large so that the pattern of light emission of the vertical cavity surface emitting laser shows a Gaussian beam profile.

The vertical cavity surface emitting laser of this example can be prepared to make the holes show a distribution of depth in a Gaussian form typically by arranging electron beam resist to a thickness distribution in a Gaussian form, producing a desired pattern by exposing the resist to an electronic beam and transferring the pattern by dry etching.

EXAMPLE 2

A vertical cavity surface emitting laser according to the present invention is prepared in Example 2 by means of a technique different from Example 1 as will be described below.

Figure 2:
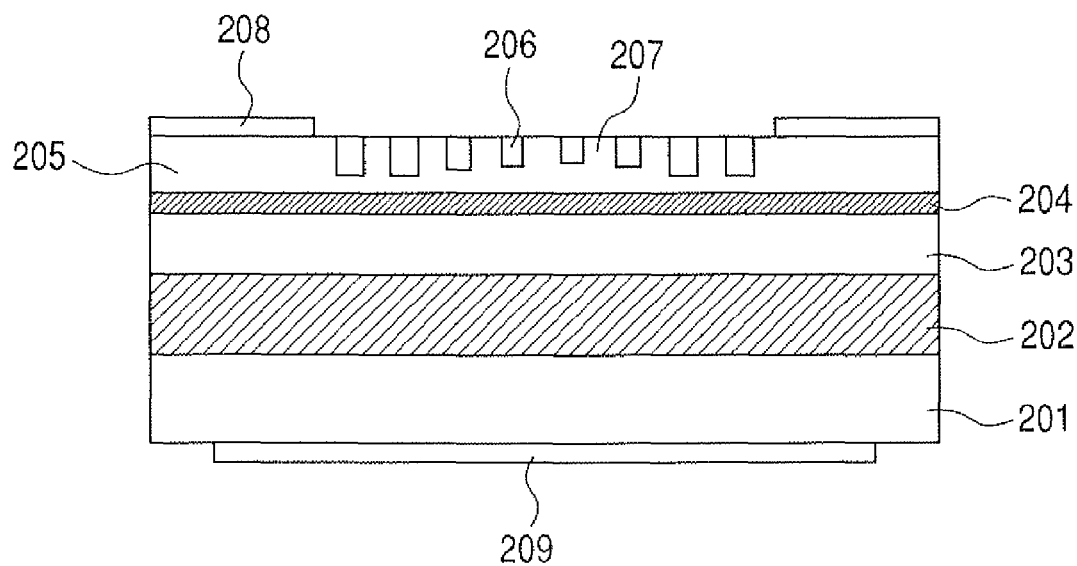
FIG. 2 is a schematic illustration of the vertical cavity surface emitting laser of Example 2, illustrating the configuration thereof.

FIG. 2 is a schematic illustration of the vertical cavity surface emitting laser of Example 2, illustrating the configuration thereof.

In FIG. 2, there are illustrated an n-type InP substrate 201, a DBR 202, a lower clad (spacer) 203, an active layer 204, an upper clad 205, cylindrical holes 206, a two-dimensional photonic crystal 207, an upper electrode 208 and a lower electrode 209.

The vertical cavity surface emitting laser of this example is basically the same as that of Example 1 except the two-dimensional photonic crystal 207. The two-dimensional photonic crystal 207 of this example is made to show a pattern where the hole diameter increases as a function of the distance from the center.

As a result of modulating the hole diameter, the depth of the holes can be modulated by utilizing the difference of etching rate due to the difference of hole diameter.

Generally, the etching rate is high when the hole diameter is large and low when the hole diameter is small.

Thus, as the two-dimensional photonic crystal 207 is made to show a pattern where the hole diameter increases as a function of the distance from the center, a distribution of depth is automatically produced after the dry etching process, where the hole depth increases as a function of the distance from the center.

By changing the hole depth in association with the hole diameter so as to show an effective refractive index distribution similar to that of Example 1, it is possible to make the pattern show a Gaussian beam profile similar to that of Example 1.

This example provides an advantage that it does not require a complex process (e.g., control of the distribution of thickness of the etching mask) if compared with Example 1.

EXAMPLE 3

In Example 3, a two-dimensional photonic crystal is formed in an upper DBR of an vertical cavity surface emitting laser having an ordinary configuration for the vertical cavity surface emitting laser of this example.

Figure 3:
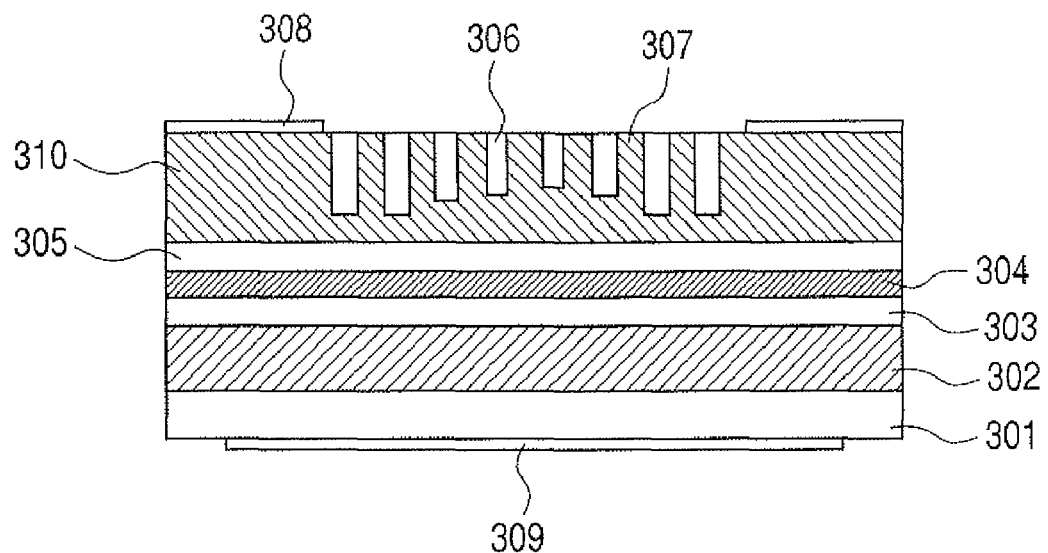
FIG. 3 is a schematic illustration of the vertical cavity surface emitting laser of Example 3, illustrating the configuration thereof.

FIG. 3 is a schematic illustration of the vertical cavity surface emitting laser of Example 3, illustrating the configuration thereof.

In FIG. 3, there are illustrated an n-type InP substrate 301, a lower DBR 302, a lower clad (spacer) 303, an active layer 304, an upper clad 305, cylindrical holes 306 and a two-dimensional photonic crystal 307.

FIG. 3 also illustrates an upper electrode 308, a lower electrode 309 and an upper DBR 310.

The vertical cavity surface emitting laser of this example is the same as that of Example 1 except the provision of the upper DBR 310.

In this example, after preparing both the upper and lower DBRs as reflectors in a vertical cavity surface emitting laser having an ordinary configuration, cylindrical holes 306 are formed in the upper DBR 310 to produce a two-dimensional photonic crystal.

The vertical cavity surface emitting laser of this example can raise the reflectivity by the DBRs and provide transverse mode control by producing an effective refractive index distribution by changing the hole depth.

EXAMPLE 4

In Example 4, a two-dimensional photonic crystal slab is formed on a vertical cavity surface emitting laser having an ordinary configuration.

Figure 4:
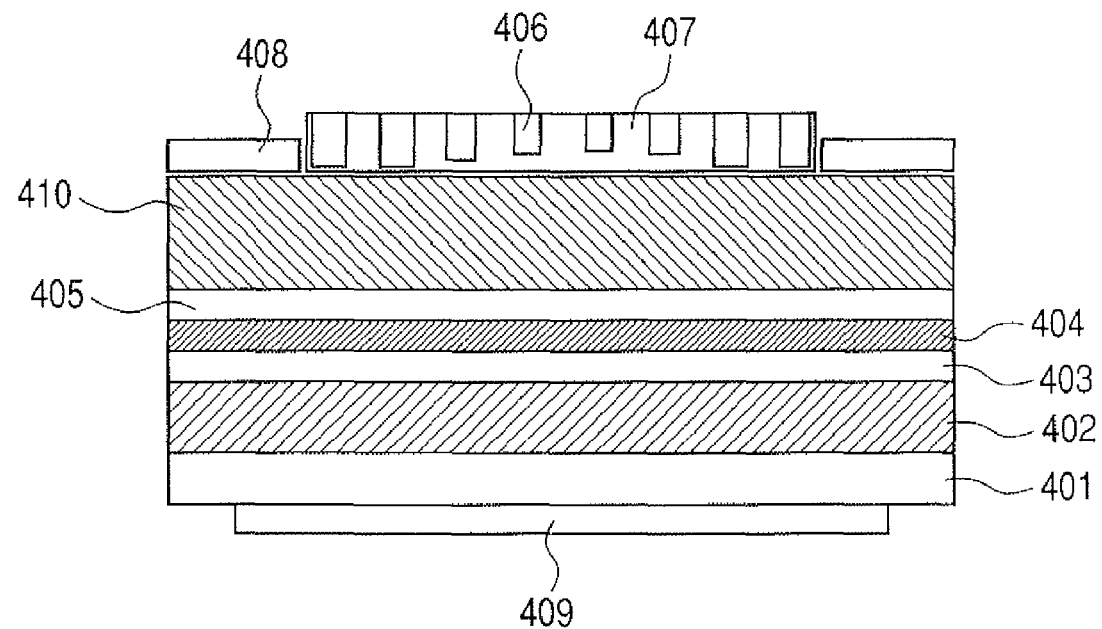
FIG. 4 is a schematic illustration of the vertical cavity surface emitting laser of Example 4, illustrating the configuration thereof.

FIG. 4 is a schematic illustration of the vertical cavity surface emitting laser of Example 4, illustrating the configuration thereof.

In FIG. 4, there are illustrated an n-type InP substrate 401, a lower DBR 402, a lower clad (spacer) 403, an active layer 404, an upper clad 405, cylindrical holes 406 and a two-dimensional photonic crystal 407.

FIG. 4 also illustrated an upper electrode 408, a lower electrode 409 and an upper DBR 410.

In this example, a two-dimensional photonic crystal 407 is formed on the upper DBR 410 after preparing a vertical cavity surface emitting laser having an ordinary configuration. The hole depth of the two-dimensional photonic crystal is modulated in a Gaussian form and increased as a function of the distance from the center as in Examples 1 through 3.

This example provides an advantage that, when the hole depth is modulated too strongly to produce a satisfactory reflectivity only by means of the photonic crystal, the DBRs of this example can supplement the insufficiency of reflectivity.

Then, as a result, the requirement for the reflectivity of the two-dimensional photonic crystal is alleviated to by turn raise the degree of design freedom.

EXAMPLE 5

In Example 5, the hole depth of a vertical cavity surface emitting laser is modulated by arranging a filler in the holes of the two-dimensional photonic crystal.

Figure 5:
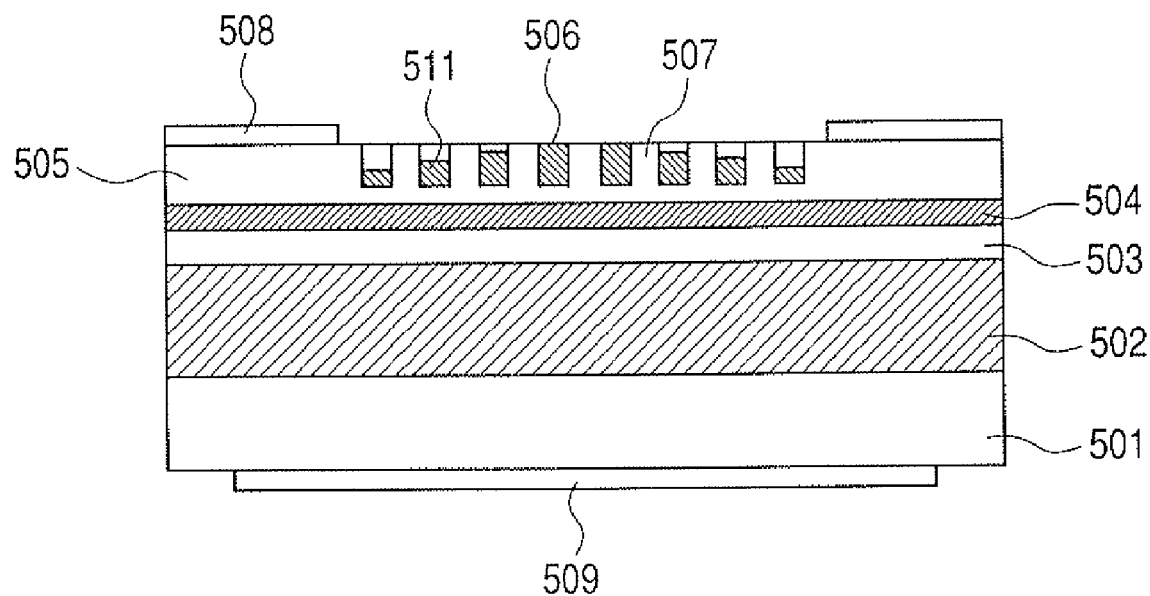
FIG. 5 is a schematic illustration of the vertical cavity surface emitting laser of Example 5, illustrating the configuration thereof.

FIG. 5 is a schematic illustration of the vertical cavity surface emitting laser of Example 5, illustrating the configuration thereof.

In FIG. 5, there are illustrated an n-type InP substrate 501, a DBR 502, a lower clad (spacer) 503, an active layer 504, an upper clad 505, cylindrical holes 506, a two-dimensional photonic crystal 507, an upper electrode 508, a lower electrode 509 and a filler 511.

In this example, after preparing a two-dimensional photonic crystal showing an uniform hole diameter and a uniform hole depth, an ununiform distribution of hole depth is produced by ununiformly arranging a filler 511 in the holes of the two-dimensional photonic crystal. In this way, it is possible to realize an ununiform effective refractive index distribution.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-051892, filed Feb. 28, 2006, which is hereby incorporated by reference herein in its entirety.

What is claimed is:

1. A surface emitting laser comprising an active layer between a first reflector and a second reflector, at least one of the first reflector and the second reflector being formed of a two-dimensional photonic crystal having a plurality of holes arranged regularly in a laser emitting region thereof, a parameter of the holes monotonically increasing as a function of the distance from a center portion of the laser emitting region, so as to diminish the effective refractive index of each reflector formed of the two-dimensional photonic crystal from a center portion of the laser emitting region toward an outer periphery thereof, and wherein the two-dimensional photonic crystal is a defect-free crystal which is not formed in a distributed Bragg reflector.

2. The laser according to claim 1, wherein a structure realizing the effective refractive index distribution is formed by modulating a depth of holes formed in the two-dimensional photonic crystal for transverse mode control.

3. The laser according to claim 2, wherein the depth of the holes is modulated by arranging a filler in the holes of the two-dimensional photonic crystal.

4. The laser according to claim 2, wherein the depth of the holes is modulated in a Gaussian form or modulated to make the depth proportional to a distance from or a square of the distance from the center portion.

5. The laser according to claim 1, wherein a structure realizing the effective refractive index distribution is formed by non-uniformly arranging a density of holes of the two-dimensional photonic crystal.

6. A method of manufacturing a two-dimensional photonic crystal of a surface emitting laser, the laser including an active layer between a first reflector and a second reflector, the method comprising:

configuring at least one of the first reflector and the second reflector to be formed of a two-dimensional photonic crystal having a plurality of holes arranged regularly in a laser emitting region thereof, a parameter of the holes monotonically increasing as a function of the distance from a center portion of the laser emitting region, so as to diminish the effective refractive index of each reflector formed of the two-dimensional photonic crystal from a center portion of the laser emitting region toward an outer periphery thereof; and forming the plurality of holes to have a non-uniform distribution of depth in the two-dimensional photonic crystal, wherein the two-dimensional photonic crystal is a defect-free crystal which is not formed in a distributed Bragg reflector.

7. The method according to claim 6, wherein the holes showing the non-uniform distribution of depth are formed by dry etching so as to show a pattern of hole diameters increasing as a function of a distance from a center of the two-dimensional photonic crystal.

8. The method according to claim 6, wherein the non-uniform distribution of depth is formed by arranging a filler in the holes of the two-dimensional photonic crystal.

9. The method according to claim 6, wherein the non-uniform distribution of depth is formed to show a Gaussian distribution profile or to make the depth of the holes proportional to a distance from or a square of the distance from the center.

* * * * *